(12) United States Patent
Hwang et al.

(10) Patent No.: US 7,575,940 B2
(45) Date of Patent: Aug. 18, 2009

(54) DIELECTRIC FILM, METHOD OF MANUFACTURING THE SAME, AND SEMICONDUCTOR CAPACITOR HAVING THE DIELECTRIC FILM

(75) Inventors: Cheol-Seong Hwang, Kyungki-do (KR); Hyun-Ju Lee, Daejeon (KR)

(73) Assignee: Seoul National University Industry Foundation, Seoul (KR)

( * ) Notice: Subject to any disclaimer, the term of this patent is extended or adjusted under 35 U.S.C. 154(b) by 85 days.

(21) Appl. No.: 11/830,227

(22) Filed: Jul. 30, 2007

(65) Prior Publication Data

US 2008/0048227 A1 Feb. 28, 2008

(30) Foreign Application Priority Data

Aug. 23, 2006 (KR) .................. 10-2006-0079717

(51) Int. Cl.
*H01L 21/00* (2006.01)
*H01L 29/76* (2006.01)

(52) U.S. Cl. ................ 438/3; 438/239; 438/396; 257/295

(58) Field of Classification Search .............. 438/3, 438/239, 240, 396; 257/295, 310
See application file for complete search history.

(56) References Cited

U.S. PATENT DOCUMENTS

| 5,986,724 A * | 11/1999 | Akiyama et al. ............. 349/41 |
| 7,428,162 B2 * | 9/2008 | Kijima et al. ............... 365/145 |
| 2004/0266031 A1 * | 12/2004 | Inomata ......................... 438/3 |
| 2006/0125052 A1 * | 6/2006 | Moon et al. ................. 257/595 |

FOREIGN PATENT DOCUMENTS

KR 1020050028748 3/2005

* cited by examiner

*Primary Examiner*—Kevin M Picardat
(74) *Attorney, Agent, or Firm*—Ladas & Parry LLP

(57) ABSTRACT

Provided are a dielectric film, a method of manufacturing the same, and a semiconductor capacitor having the dielectric film. The semiconductor capacitor includes a lower electrode, a ferroelectric layer disposed on the lower electrode, a paraelectric layer disposed on the ferroelectric layer, and an upper electrode disposed on the paraelectric layer.

13 Claims, 6 Drawing Sheets

DIELECTRIC FILM, METHOD OF MANUFACTURING THE SAME, AND SEMICONDUCTOR CAPACITOR HAVING THE DIELECTRIC FILM

CROSS-REFERENCE TO RELATED APPLICATION

This application claims priority to Korean Patent Application No. 2006-0079717 filed on Aug. 23, 2006 and all the benefits accruing therefrom under 35 U.S.C. §119, the contents of which are incorporated by reference in their entirety.

BACKGROUND

The present disclosure relates to a dielectric film, a method of manufacturing the same, and a semiconductor capacitor having the dielectric film, and more particularly, to a dielectric film having a ferroelectric layer, a method of manufacturing the same, and a semiconductor capacitor having the dielectric film.

Pb-containing perovskite compounds exhibit good dielectric, ferroelectric, piezoelectric, and optoelectric properties. Pb-containing perovskite compounds are widely used in ferroelectric random access memories (FRAMs), piezo-resistive sensors, actuators, integrated optical devices, etc.

One of typical perovskite compounds is $Pb(Zr,Ti)O_3$ (PZT) that has a higher electromechanical coupling coefficient than $BaTiO_3$ and also has a good temperature stability over a wide temperature range. $Pb(Zr,Ti)O_3$ layers must be at least approximately 2,000 Å in thickness so as to ensure a high remanent polarization, a high drivability, a high dielectric breakdown voltage, a high coercive voltage, and a durability against external environment.

As most of electromechanical devices as well as memories are further miniaturized, $Pb(Zr,Ti)O_3$ layers are required to be thin while ensuring good dielectric characteristics. Thin $Pb(Zr,Ti)O_3$ layers, however, cannot ensure a high remanent polarization, a high drivability, a high dielectric breakdown voltage, a high coercive voltage, and a durability against external environment. Consequently, desired device characteristics cannot be obtained.

When a ferroelectric layer having a thickness greater than 2,000 Å is interposed as a dielectric film between two electrodes of the semiconductor capacitor, it is difficult to obtain a desired capacitance of the semiconductor capacitor because the capacitance of the semiconductor capacitor is in inverse proportion to the thickness of the dielectric film.

Therefore, the perovskite ferroelectric layer such as the $Pb(Zr,Ti)O_3$ layer has a trade-off relationship between the dielectric characteristic and the capacitance of the semiconductor capacitor. Hence, it is difficult to satisfy both of the dielectric characteristic and the capacitance of the semiconductor capacitor.

In micro-electromechanical systems (MEMS), the ferroelectric layer works as the key functional layer due to its higher piezoelectric coefficient compared to that of other piezoelectric materials, such as ZnO or GaN, where the piezoelectric properties are used to convert the electrical signal to the mechanical movements. In order to realize this, the ferroelectric layer usually should be poled into one poling direction by application of a proper electric voltage. By this poling, the ferroelectric layer has a uniform ferroelectric domain distribution and shows the proper electromechanical behaviors. During its normal service, the repeated electrical signal might depole the ferroelectric layer and its functionality becomes degraded. In order to suppress these deleterious effects, the ferroelectric layer should have a high remanent polarization and high coercive voltage. Conventionally, these purposes have been achieved by either increasing the ferroelectric layer thickness or increasing process temperature which both impose several problems in fabricating the MEMS devices. In addition, the usual ferroelectric layers have lower polarization when the coercive voltage is high and vice versa.

SUMMARY

Therefore, here we invent a new way to increase simultaneously the polarization and coercive voltage by simply stacking the ferroelectric and paraelectric layers, which is very desirable in many applications including the MEMS area.

The present disclosure provides a dielectric film having a thin ferroelectric layer while ensuring a high remanent polarization characteristic and a high coercive voltage characteristic.

The present disclosure also provides a method of manufacturing the dielectric film.

The present disclosure also provides a semiconductor capacitor having a high capacitance while ensuring a high remanent polarization characteristic and a high coercive voltage characteristic According to an exemplary embodiment, a dielectric film includes a ferroelectric layer, and a paraelectric layer disposed on the ferroelectric layer.

According to another exemplary embodiment, a method of manufacturing a dielectric film includes forming a ferroelectric layer, and forming a paraelectric layer on the ferroelectric layer. The ferroelectric layer may be formed by a sol-gel process, a chemical vapor deposition (CVD), an atomic layer deposition (ALD) or a sputtering process, and the paraelectric layer may be formed by an ALD or a CVD process.

Prior to the forming of the paraelectric layer, the method may further include annealing the ferroelectric layer at 400-700° C. for 1-300 minutes so as to give crystallinity to the ferroelectric layer.

According to yet another exemplary embodiment, a semiconductor capacitor includes: a lower electrode; a ferroelectric layer disposed on the lower electrode; a paraelectric layer disposed on the ferroelectric layer; and an upper electrode disposed on the paraelectric layer.

The ferroelectric layer may include at least one perovskite compound selected from the group consisting of $Pb(Zr,Ti)O_3$ (PZT), $SrBi_2Ta_2O_9$ (SBT), $(Bi_x,La_{1-x})_4Ti_3O_{12}$ (BLT), $SrBi_2(Ta,Nb)O_9$ (SBTN), and $Ba_xSr_{(1-x)}TiO_3$ (BST). The ferroelectric layer may be crystallized in a (111) crystal orientation. Furthermore, the ferroelectric layer may have a thickness ranging from approximately 100 Å to approximately 10,000 Å. Even when the ferroelectric layer is formed to a thickness ranging from approximately 500 Å to approximately 2,000 Å, it has good characteristics in view of a drivability, a dielectric breakdown voltage, a durability, a remanent polarization, and a coercive voltage.

The paraelectric layer may include at least one material selected from the group consisting of aluminum oxide ($Al_2O_3$), hafnium oxide ($HfO_2$), titanium oxide ($TiO_2$), zirconium oxide ($ZrO_2$), tantalum oxide ($Ta_2O_5$), and niobium oxide ($Nb_2O_5$). The paraelectric layer may have a thickness ranging from approximately 5 Å to approximately 200 Å.

According to yet another exemplary embodiment, a semiconductor capacitor includes: a lower electrode; a paraelectric layer disposed on the lower electrode; a ferroelectric layer disposed on the paraelectric layer; and an upper electrode disposed on the ferroelectric layer.

In the exemplary embodiments, the stacked structure of the ferroelectric layer and the paraelectric layer is used as the dielectric film of the semiconductor capacitor. Even when the ferroelectric layer is formed thinly in the range less than approximately 1,000 Å, its dielectric characteristics can be maintained in a thick-film level (approximately 2,000 Å) in view of a drivability, a dielectric breakdown voltage, a durability, a remanent polarization, and a coercive voltage.

BRIEF DESCRIPTION OF THE DRAWINGS

Exemplary embodiments can be understood in more detail from the following description taken in conjunction with the accompanying drawings, in which.

DETAILED DESCRIPTION OF EMBODIMENTS

Hereinafter, specific embodiments will be described in detail with reference to the accompanying drawings.

In exemplary embodiments, by forming a paraelectric layer on a ferroelectric layer, the ferroelectric layer can be formed thinly while ensuring its inherent characteristics. The ferroelectric layer may be formed by a sol-gel process or a sputtering process. The paraelectric layer disposed on the ferroelectric layer may be formed by an atomic layer deposition (ALD) process. Although not intended to be bound by specific theories, it is speculated that the reason why the ferroelectric layer can be formed thinly while ensuring its inherent characteristics is that the paraelectric layer repairs internal defects of the ferroelectric layer during the ALD process. Because the ferroelectric layer can be formed thinly while obtaining dielectric characteristics up to a thick-film level, a large capacitance can be obtained and a leakage current characteristic can be improved. Furthermore, because the dielectric film has a high coercive voltage, a semiconductor capacitor having the dielectric film is adapted for microelectromechanical systems (MEMS) requiring a high coercive voltage.

Figure 1:
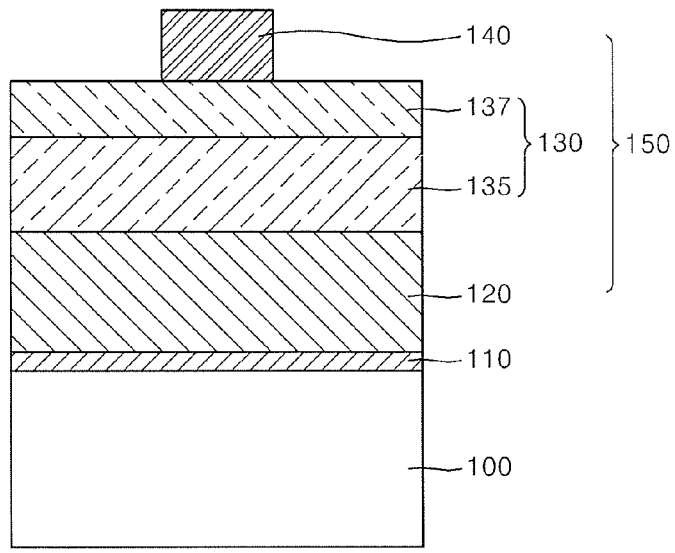
FIG. 1 is a cross-sectional view of a semiconductor capacitor having a stacked structure of a ferroelectric layer and a paraelectric layer according to an exemplary embodiment.

FIG. 1 is a cross-sectional view of a semiconductor capacitor according to an exemplary embodiment.

Referring to FIG. 1, a semiconductor capacitor 150 includes a lower electrode 120, a dielectric film 130, and an upper electrode 140, which are sequentially disposed on a semiconductor substrate 100.

The lower electrode 120 may be formed of precious metals (e.g., platinum (Pt), ruthenium (Ru), iridium (Ir), etc.), refractory metals (e.g., titanium (Ti), tantalum (Ta), tungsten (W), etc.), refractory metal nitrides (e.g., titanium nitride (TiN), tantalum nitride (TaN), tungsten nitride (WN), etc.), or conductive oxides (e.g., ruthenium oxide ($RuO_2$), iridium oxide ($IrO_2$), strontium ruthenium oxide ($SrRuO_3$), etc.). In addition, a transistor (not shown) and an insulator (not shown) may be interposed between the semiconductor substrate 100 and the lower electrode 120. The transistor (not shown) is provided for accessing the semiconductor capacitor 150, and the insulator (not shown) is provided for electrically insulating the transistor (not shown) from the semiconductor capacitor 150. Furthermore, an adhesive layer 110 may be disposed on the semiconductor substrate 100, and more specifically, may be interposed between the insulator (not shown) and the lower electrode 120 so as to increase adhesion between the insulator (not shown) and the semiconductor capacitor 150. The adhesive layer 110 may be formed of, for example, titanium (Ti). In this exemplary embodiment, the lower electrode 120 is formed of platinum (Pt).

Although the lower electrode 120 is illustrated in a stack type in FIG. 1, it may be a cylindrical electrode, in which the top, outer and inner surfaces are all used as a capacitor region, or a concave electrode, in which only the top and inner surfaces are used as a capacitor region.

In this exemplary embodiment, the dielectric film 130 has a stacked structure of a ferroelectric layer 135 and a paraelectric layer 137. More specifically, the ferroelectric layer 135 and the paraelectric layer 137 are sequentially stacked on the lower electrode 120 to form the dielectric film 130 of the semiconductor capacitor.

The ferroelectric layer 135 may include at least one perovskite ferroelectric material selected from the group consisting of Pb(Zr,Ti)O$_3$ (PZT), SrBi$_2$Ta$_2$O$_9$ (SBT), (Bi$_x$,La$_{1-x}$)$_4$Ti$_3$O$_{12}$ (BLT), SrBi$_2$(Ta,Nb)O$_9$ (SBTN), and Ba$_x$Sr$_{(1-x)}$TiO$_3$ (BST). Hence, the ferroelectric layer 135 may have a single layer structure or a multi-layer structure where a variety of layers are formed in sequence. The ferroelectric layer 135 may have a thickness ranging from approximately 100 Å to approximately 10,000 Å. More specifically, the ferroelectric layer 135 may be formed to a thickness ranging from approximately 500 Å to approximately 2,000 Å by a spin coating process using a sol-gel process or a sputtering process. Then, the ferroelectric layer 135 may be annealed at 400-700° C. for 1-300 minutes, preferably 20-40 minutes, so as to give crystallinity to the ferroelectric layer 135. In particular, the PZT ferroelectric layer 135 has crystallinity in a (111) crystal orientation by the annealing process.

The paraelectric layer 137 disposed on the ferroelectric layer 135 includes at least one high-dielectric-constant (high-k) material selected from the group consisting of aluminum oxide (Al$_2$O$_3$), hafnium oxide (HfO$_2$), titanium oxide (TiO$_2$), zirconium oxide (ZrO$_2$), tantalum oxide (Ta$_2$O$_5$), and niobium oxide (Nb$_2$O$_5$). Hence, the paraelectric layer 137 may have a single layer structure or a multi-layer structure where a variety of layers are formed in sequence. The paraelectric layer 137 may have a thickness ranging from approximately 5 Å to approximately 200 Å. The paraelectric layer 137 may be formed by an atomic layer deposition (ALD) process.

A formation of the paraelectric layer 137 according to an exemplary embodiment will be described below with reference to FIGS. 2(a) through 2(d). In this exemplary embodiment, the paraelectric layer 137 is formed of aluminum oxide (Al$_2$O$_3$) by an ALD process.

Figure 2:
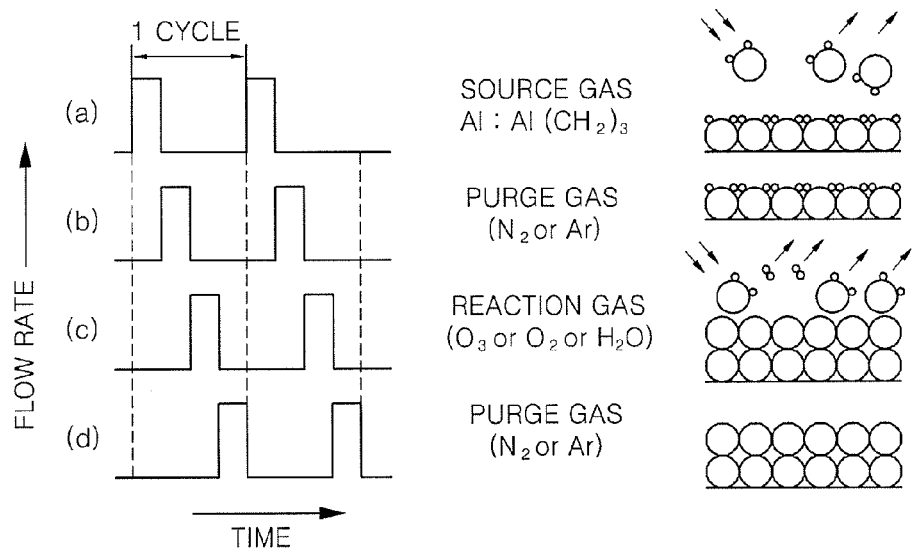
FIGS. 2(a) through 2(d) are timing diagrams illustrating a method of manufacturing a paraelectric layer according to an exemplary embodiment.

Referring to FIG. 2(a), aluminum source gas is supplied on the ferroelectric layer 135 at regular periods. Al(CH$_3$)$_3$ gas may be used as the aluminum source gas. Aluminum source gas is chemically adsorbed onto the surface of the ferroelectric layer 135 and then is physically adsorbed thereon. Referring to FIG. 2(b), a purge gas such as nitrogen (N$_2$) gas or argon (Ar) gas is supplied to remove the physically adsorbed aluminum source gas. Referring to FIG. 2(c), an oxygen containing gas, e.g., O$_3$ gas, O$_2$ gas or H$_2$O gas, is supplied at regular periods to react with the chemically adsorbed aluminum source gas. Referring to FIG. 2(d), oxygen containing gas that does not react with the aluminum source gas is removed by supplying a purge gas. In this way, the paraelectric layer 137 is formed. 1 cycle is defined by the processes of FIGS. 2(a) through 2(d). These processes are repeated until the paraelectric layer 137 is formed up to a desired thickness.

The paraelectric layer 137 serves to repair internal defects of the ferroelectric layer 135. Therefore, even when the ferroelectric layer 135 is formed thinly in the range from approximately 500 Å to approximately 2,000 Å, its dielectric characteristics are maintained in a thick-film level in view of a drivability characteristic, a remanent polarization characteristic, a coercive voltage characteristic, and a leakage current characteristic. Furthermore, the paraelectric layer 137 is interposed between the ferroelectric layer 135 and the upper electrode 140, which will be described later. The paraelectric layer 137 performs an electrical function, which is differentiated from a typical passivation layer that prevents the change of electrical characteristics of the semiconductor capacitor.

Referring again to FIG. 1, the upper electrode 140 is disposed on the paraelectric layer 137. Like the lower electrode 120, the upper electrode 140 may be formed of precious metals (e.g., platinum (Pt), ruthenium (Ru), iridium (Ir), etc.), refractory metals (e.g., titanium (Ti), tantalum (Ta), tungsten (W), etc.), refractory metal nitrides (e.g., titanium nitride (TiN), tantalum nitride (TaN), tungsten nitride (WN), etc.), or conductive oxides (e.g., ruthenium oxide (RuO$_2$), iridium oxide (IrO$_2$), strontium ruthenium oxide (SrRuO$_3$), etc.).

In the above-described semiconductor capacitor 150 having the ferroelectric layer 135, defects inside the ferroelectric layer 135 can be repaired by forming the paraelectric layer 137 on the ferroelectric layer 135. Hence, even though the thickness of the ferroelectric layer 135 is reduced, its dielectric characteristics can be maintained in the thick-film level.

The thinning of the ferroelectric layer can be achieved while ensuring good characteristics, thereby making it possible to fabricate large-capacity capacitors. Furthermore, as will be described in more detail in the following examples, the dielectric film 130 having the stacked structure of the ferroelectric layer 135 and the paraelectric layer 137 has a high remanent polarization and a high coercive voltage. Therefore, the dielectric film 130 can be applied to a variety of devices requiring a high coercive voltage in the field of micro-electromechanical systems (MEMS). More specifically, the dielectric film 130 according to the exemplary embodiment can be applied to RF switches using piezoelectric characteristics of PZT, micromirrors, piezo-resistive sensors, and other devices requiring both the high remanent polarization and the high coercive voltage in MEMS applications. In other words, the dielectric film 130 is adapted for device applications requiring that, once a poling is performed, a polarization switching must not be performed by an operating voltage.

<Experiment 1>

Figure 3:
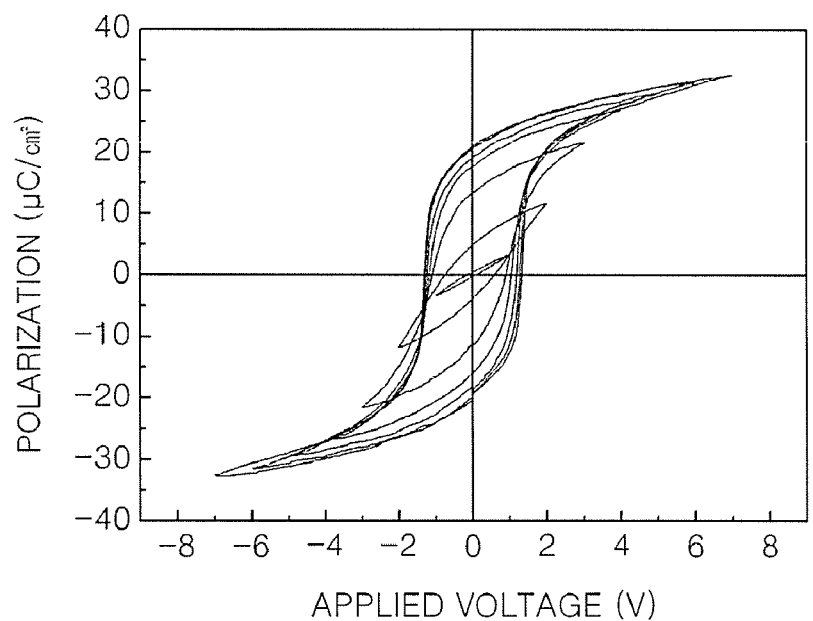
FIG. 3 is a graph illustrating a polarization-voltage (P-V) hysteresis loop of a typical semiconductor capacitor having a single ferroelectric layer as a dielectric film.
Figure 4:
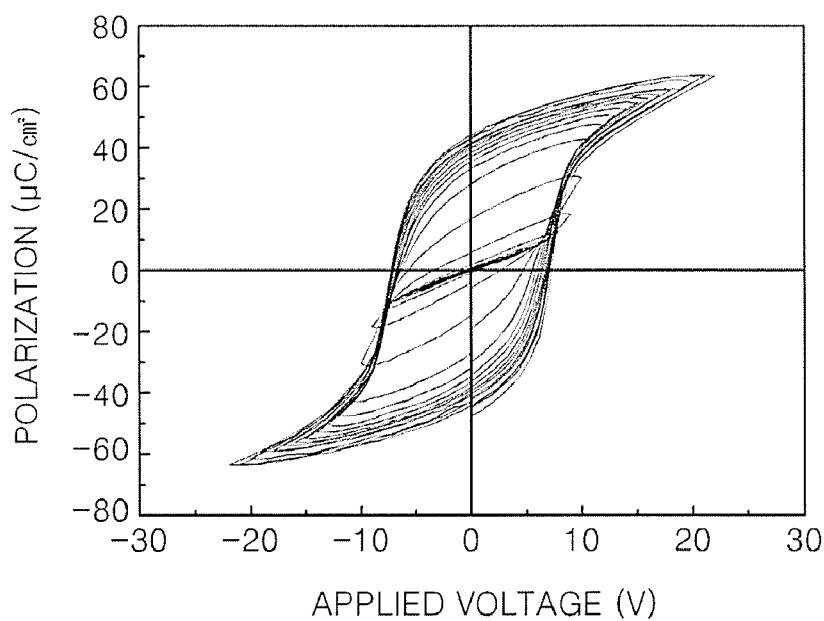
FIG. 4 is a graph illustrating a P-V hysteresis loop of a semiconductor capacitor having a stacked structure of a ferroelectric layer and a paraelectric layer as a dielectric film according to an exemplary embodiment, when the paraelectric layer is deposited to a thickness of 44 Å.
Figure 5:
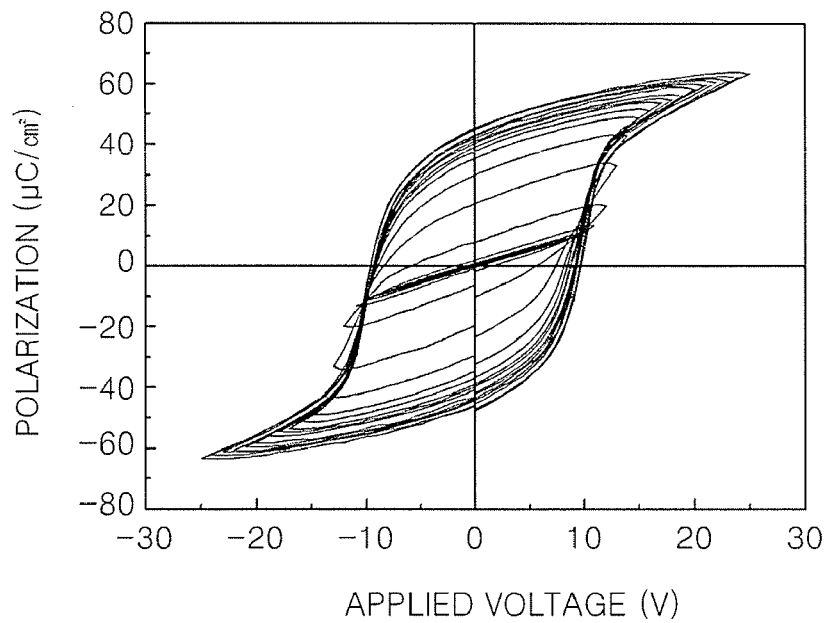
FIG. 5 is a graph illustrating a P-V hysteresis loop of the semiconductor capacitor having the stacked structure of the ferroelectric layer and the paraelectric layer as the dielectric film according to the exemplary embodiment, when the paraelectric layer is deposited to a thickness of 69 Å.
Figure 6:
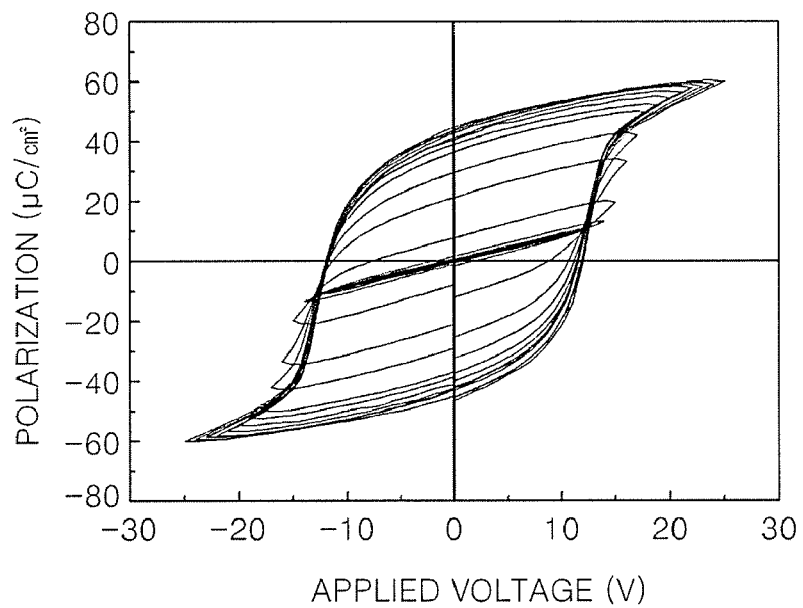
FIG. 6 is a graph illustrating a P-V hysteresis loop of the semiconductor capacitor having the stacked structure of the ferroelectric layer and the paraelectric layer as the dielectric film according to the exemplary embodiment, when the paraelectric layer is deposited to a thickness of 92 Å.
Figure 7:
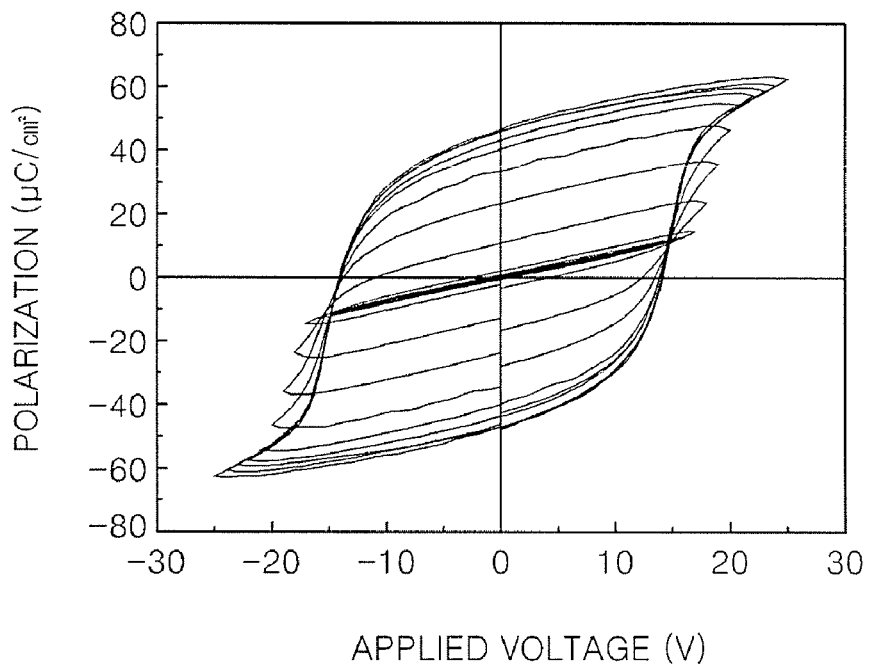
FIG. 7 is a graph illustrating a P-V hysteresis loop of the semiconductor capacitor having the stacked structure of the ferroelectric layer and the paraelectric layer as the dielectric film according to the exemplary embodiment, when the paraelectric layer is deposited to a thickness of 117 Å.

FIGS. 3 through 7 are graphs illustrating polarization-voltage (P-V) hysteresis loops of semiconductor capacitors having a ferroelectric layer as a dielectric film. Specifically, FIG. 3 illustrates the P-V hysteresis loop of the semiconductor capacitor having a single ferroelectric layer as a dielectric film, and FIGS. 4 through 7 illustrate the P-V hysteresis loops of the semiconductor capacitors having a stacked structure of a ferroelectric layer and a paraelectric layer as a dielectric film according to exemplary embodiments. In these exemplary embodiments, the ferroelectric layer and the paraelectric layer were formed of Pb(Zr,Ti)O$_3$ and Al$_2$O$_3$, respectively. In addition, when the thicknesses of the paraelectric layers illustrated in FIGS. 4 through 7 were 44 Å, 69 Å, 92 Å, and 117 Å, respectively, the polarizations of the semiconductor capacitors with respect to an external voltage were measured in each thickness.

As illustrated in FIG. 3, when the single ferroelectric layer was used as the dielectric film of the semiconductor capacitor, the semiconductor capacitor exhibited a polarization of approximately 20.99 μC/cm$^2$ and a coercive voltage of approximately 1.33 V.

On the other hand, as illustrated in FIGS. 4 through 7, when the Al$_2$O$_3$ paraelectric layer was formed on the Pb(Zr,Ti)O$_3$ ferroelectric layer, the semiconductor capacitors exhibited a polarization of approximately 45 μC/cm$^2$, which was twice higher than that of the semiconductor capacitor of FIG. 3. In addition, the coercive voltage was gradually increased in proportion to the thickness of the Al$_2$O$_3$ paraelectric layer.

The result of the experiment shows that the polarization characteristics of the semiconductor capacitors were improved more than two times in the use of the stacked structure of the ferroelectric layer and the paraelectric layer than in the use of the single ferroelectric layer. Furthermore, the coercive voltages were gradually increased with the thickness of the Al$_2$O$_3$ paraelectric layer.

<Experiment 2>

Figure 8:
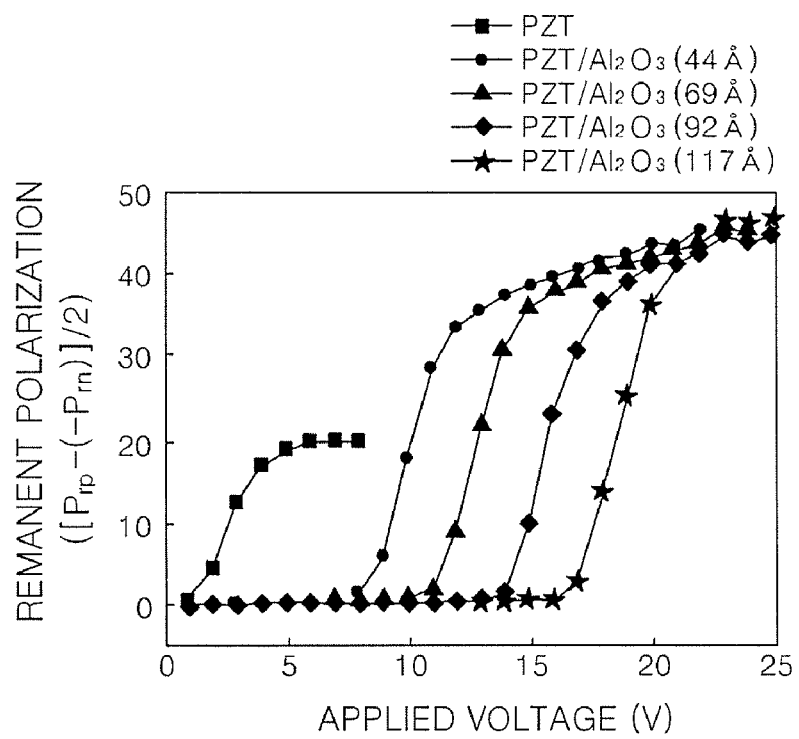
FIG. 8 is a graph illustrating a remanent polarization with respect to an external voltage applied across the semiconductor capacitor having the stacked structure of the ferroelectric layer and the paraelectric layer as the dielectric film according to the exemplary embodiment.

FIG. 8 is a graph illustrating a remanent polarization with respect to an external voltage applied across the semiconductor capacitor having the stacked structure of the ferroelectric layer and the paraelectric layer according to the exemplary embodiment. In this exemplary embodiment, the ferroelectric layer and the paraelectric layer were formed of $Pb(Zr,Ti)O_3$ and $Al_2O_3$, respectively. In addition, when the thicknesses of the $Al_2O_3$ paraelectric layers were 44 Å, 69 Å, 92 Å, and 117 Å, the remanent polarizations of the semiconductor capacitors with respect to an external voltage were measured in each thickness.

Referring to FIG. 8, the remanent polarizations when the stacked structure of the ferroelectric layer and the paraelectric layer was used as the dielectric film, which is indicated by symbols -●-, -▲-, -♦- and -★-, were increased by approximately 25 μC/cm² than the remanent polarization when the single ferroelectric layer was used as the dielectric film, which is indicated by a symbol -■-. The remanent polarization has no direct association with the thickness of the paraelectric layer. If only the paraelectric layer is formed, the remanent polarization characteristic can be improved.

<Experiment 3>

Figure 9:
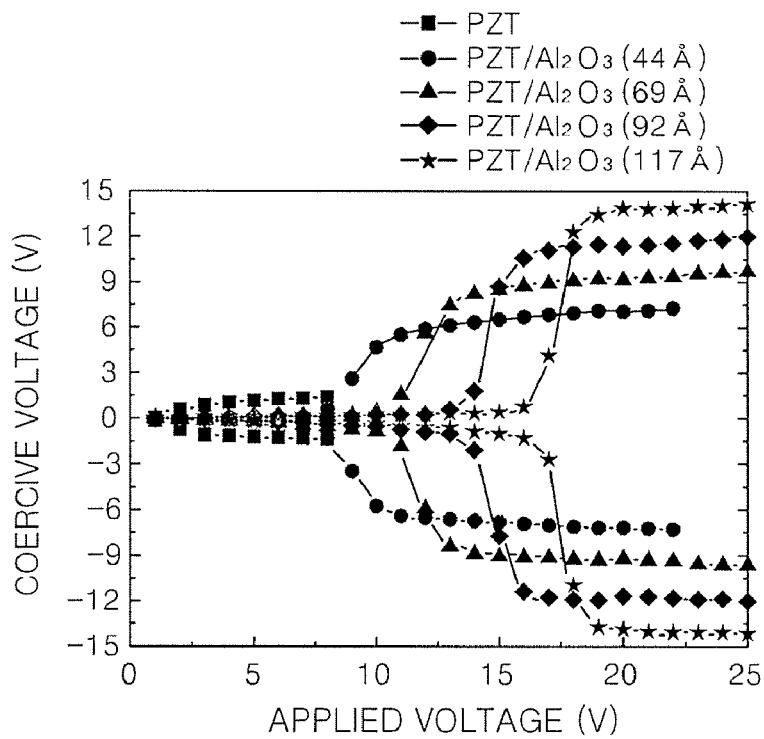
FIG. 9 is a graph illustrating a coercive voltage with respect to an external voltage applied across the semiconductor capacitor having the stacked structure of the ferroelectric layer and the paraelectric layer as the dielectric film according to the exemplary embodiment.

FIG. 9 is a graph illustrating a coercive voltage with respect to an external voltage applied across the semiconductor capacitor having the stacked structure of the ferroelectric layer and the paraelectric layer according to the exemplary embodiment. In this exemplary embodiment, the ferroelectric layer and the paraelectric layer were formed of $Pb(Zr,Ti)O_3$ and $Al_2O_3$, respectively. In addition, when the thicknesses of the $Al_2O_3$ paraelectric layers were 44 Å, 69 Å, 92 Å, and 117 Å, the coercive voltages of the semiconductor capacitors with respect to an external voltage were measured in each thickness.

Referring to FIG. 9, as the thickness of the $Al_2O_3$ paraelectric layer was increased, the coercive voltage was also increased. More specifically, when the single ferroelectric layer was used as the dielectric film of the semiconductor capacitor, which is indicated by a symbol -■-, the coercive voltage was approximately 1.33 V. When the thickness of the $Al_2O_3$ paraelectric layer was 44 Å, which is indicated by a symbol -●-, the coercive voltage was approximately 6.7 V. When the thickness of the $Al_2O_3$ paraelectric layer was 69 Å, which is indicated by a symbol -▲-, the coercive voltage was approximately 8.8 V. When the thickness of the $Al_2O_3$ paraelectric layer was 92 Å, which is indicated by a symbol -♦-, the coercive voltage was approximately 11.5 V. When the thickness of the $Al_2O_3$ paraelectric layer was 117 Å, which is indicated by a symbol -★-, the coercive voltage was approximately 14.8 V. The result of the experiment shows that the coercive voltage can be adjusted by the thickness of the paraelectric layer.

<Experiment 4>

Figure 10:
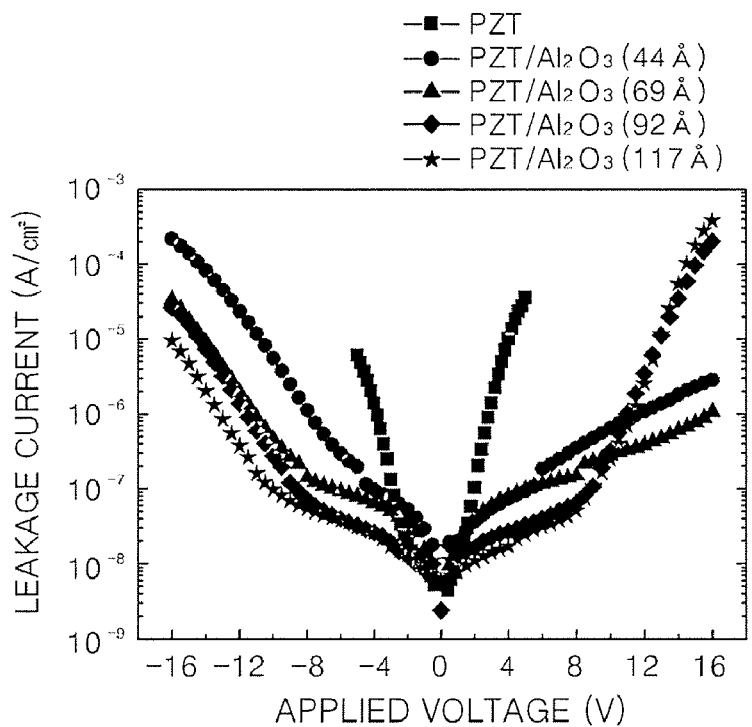
FIG. 10 is a graph illustrating a leakage current with respect to an external voltage applied across the semiconductor capacitor having the stacked structure of the ferroelectric layer and the paraelectric layer as the dielectric film according to the exemplary embodiment.

FIG. 10 is a graph illustrating a leakage current with respect to an external voltage applied across the semiconductor capacitor having the stacked structure of the ferroelectric layer and the paraelectric layer according to the exemplary embodiment. In this exemplary embodiment, the ferroelectric layer and the paraelectric layer were formed of $Pb(Zr,Ti)O_3$ and $Al_2O_3$, respectively. In addition, when the thicknesses of the $Al_2O_3$ paraelectric layers were 44 Å, 69 Å, 92 Å, and 117 Å, the coercive voltages of the semiconductor capacitors with respect to an external voltage were measured in each thickness.

Referring to FIG. 10, the leakage current characteristic when the stacked structure of the ferroelectric layer and the paraelectric layer was used as the dielectric film, which is indicated by symbols -●-, -▲-, -♦- and -★-, was more stable than that when the single ferroelectric layer was used as the dielectric film, which is indicated by a symbol -■-. Furthermore, as the thickness of the paraelectric layer was increased, the leakage current was decreased.

Figure 11:
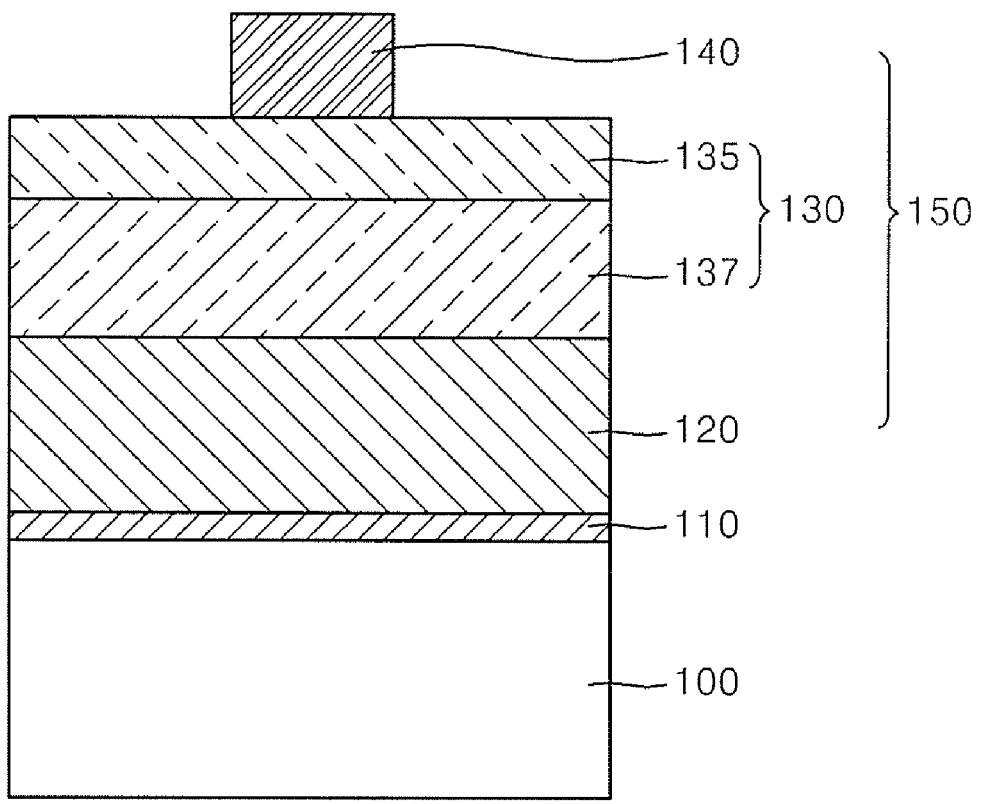
FIG. 11 is a cross-sectional view of a semiconductor capacitor having a stacked structure of a ferroelectric layer and a paraelectric layer according to another exemplary embodiment.

The present invention is not limited to the above-described exemplary embodiments. Although the stacked structure of the ferroelectric layer and the paraelectric layer has been provided as the dielectric film of the semiconductor capacitor in the above exemplary embodiments, their stacking order may be changed. As illustrated in FIG. 11, the paraelectric layer 137 and the ferroelectric layer 135 may be sequentially formed on the lower electrode 120. In other words, according to yet another exemplary embodiment, a semiconductor capacitor 150 includes a lower electrode 100, a paraelectric layer 137 disposed on the lower electrode 100, a ferroelectric layer 135 disposed on the paraelectric layer 137 and an upper electrode 140 disposed on the ferroelectric layer 135.

In this exemplary embodiment, although the stacked structure of the ferroelectric layer and the paraelectric layer is applied to the dielectric film of the semiconductor capacitor, the paraelectric layer can improve the coercive voltage characteristic while thinning the ferroelectric layer. Hence, the dielectric film can be applied to a variety of applications requiring both the high remanent polarization and the high coercive voltage.

As described above, the stacked structure of the ferroelectric layer and the paraelectric layer is used as the dielectric film of the semiconductor capacitor. Even when the ferroelectric layer is formed thinly in the range less than approximately 1,000 Å, its dielectric characteristics can be maintained in a thick-film level (approximately 2,000 Å) in view of a drivability, a dielectric breakdown voltage, a durability, a remanent polarization, and a coercive voltage.

Therefore, a large capacitance can be obtained because the ferroelectric layer can be formed thinly while obtaining dielectric characteristics up to a thick-film level. Furthermore, the dielectric film according to the exemplary embodiments can be applied to a variety of devices requiring a high coercive voltage in the field of micro-electromechanical systems (MEMS). More specifically, the dielectric film according to the exemplary embodiments can be applied to RF switches, micromirrors, piezo-resistive sensors, and other devices requiring both the high remanent polarization and the high coercive voltage in MEMS applications.

Although the dielectric film, the method of manufacturing the same, and the semiconductor capacitor having the dielectric film have been described with reference to the specific embodiments, they are not limited thereto. Therefore, it will be readily understood by those skilled in the art that various modifications and changes can be made thereto without departing from the spirit and scope of the present invention defined by the appended claims.

What is claimed is:

1. A ferroelectric substance, comprising:
   a ferroelectric layer; and
   a paraelectric layer disposed on a surface of the ferroelectric layer,
   wherein the ferroelectric layer and the paraelectric layer are formed to a thickness at which a remnant polarization and a coercive field of the ferroelectric substance is larger than a remnant polarization and a coercive field of the ferroelectric layer, and a thickness of the paraelectric layer is smaller than a thickness of the ferroelectric layer.

2. The ferroelectric substance of claim 1, wherein the ferroelectric layer comprises at least one material selected from the group consisting of Pb(Zr,Ti)O$_3$(PZT), SrBi$_2$Ta$_2$O$_9$ (SBT), (Bi$_x$,La$_{1-x}$)$_4$Ti$_3$O$_{12}$(BLT), SrBi$_2$(Ta,Nb)O$_9$(SBTN), and Ba$_x$Sr$_{(1-x)}$TiO$_3$(BST).

3. The ferroelectric substance of claim 1, wherein the paraelectric layer comprises at least one material selected from the group consisting of aluminum oxide (Al$_2$O$_3$), hafnium oxide (HfO$_2$), titanium oxide (TiO$_2$), zirconium oxide (ZrO$_2$), tantalum oxide (Ta$_2$O$_5$), and niobium oxide (Nb$_2$O$_5$).

4. A method of manufacturing a ferroelectric substance, comprising:
forming a ferroelectric layer; and
forming a paraelectric layer on a surface of the ferroelectric layer,
wherein a thickness of the ferroelectric layer and a thickness of the paraelectric layer are set so that a remnant polarization and a coercive field of the ferroelectric substance is larger than a remnant polarization and a coercive field of the ferroelectric layer and the paraelectric layer is formed so that a thickness of the paraelectric layer is smaller than a thickness of the ferroelectric layer.

5. The method of claim 4, wherein the ferroelectric layer is formed by a sol-gel process or a sputtering process.

6. The method of claim 4, wherein the paraelectric layer is formed by an ALD process.

7. The method of claim 4, further comprising, prior to the forming of the pyroelectric layer, annealing the ferroelectric layer at 600-700° C. for 10-50 minutes so as to give crystallizing to the ferroelectric layer.

8. A semiconductor capacitor, comprising:
a lower electrode;
a ferroelectric substance film disposed on the lower electrode and comprising a ferroelectric layer and a paraelectric layer disposed on a surface of the ferroelectric layer to have a thickness that is smaller than a thickness of the ferroelectric layer; and
an upper electrode disposed on the ferroelectric substance film,
wherein the ferroelectric layer and the paraelectric layer are formed to a thickness at which a remnant polarization and a coercive field of the ferroelectric substance film is larger than a remnant polarization and a coercive field of the ferroelectric layer.

9. The semiconductor capacitor of claim 8, wherein the ferroelectric layer comprises at least one material selected from the group consisting of Pb(Zr,Ti)O$_3$(PZT), SrBi$_2$Ta$_2$O$_9$ (SBT), (Bi$_x$,La$_{1-x}$)$_4$Ti$_3$O$_{12}$(BLT), SrBi$_2$(Ta,Nb)O$_9$(SBTN), and Ba$_x$Sr$_{(1-x)}$TiO$_3$(BST).

10. The semiconductor capacitor of claim 9, wherein the ferroelectric layer has a thickness ranging from approximately 500 Å to approximately 10,000 Å.

11. The semiconductor capacitor of claim 8, wherein the paraelectric layer comprises at least one material selected from the group consisting of aluminum oxide (Al$_2$O$_3$), hafnium oxide (HfO$_2$), titanium oxide (TiO$_2$), zirconium oxide (ZrO$_2$), tantalum oxide (Ta$_2$O$_5$), and niobium oxide (Nb$_2$O$_5$).

12. The semiconductor capacitor of claim 11, wherein the paraelectric layer has a thickness ranging from approximately 5 Å to approximately 200 Å.

13. The semiconductor capacitor of claim 8, wherein the ferroelectric layer is formed by a sol-gel process or a sputtering process, and the paraelectric layer is formed by an atomic layer deposition (ALD) process.

* * * * *